United States Patent [19]

Wiedmann

[11] 4,306,159
[45] Dec. 15, 1981

[54] BIPOLAR INVERTER AND NAND LOGIC CIRCUIT WITH EXTREMELY LOW DC STANDBY POWER

[75] Inventor: Siegfried K. Wiedmann, Peekskill, N.Y.

[73] Assignee: International Business Machines Corporation, Armonk, N.Y.

[21] Appl. No.: 48,423

[22] Filed: Jun. 14, 1979

[51] Int. Cl.³ .................................... H03K 19/20
[52] U.S. Cl. ............................ 307/457; 307/255; 307/456
[58] Field of Search ................. 307/214, 215, 255

[56] References Cited

U.S. PATENT DOCUMENTS

| | | | |
|---|---|---|---|
| 3,183,366 | 5/1965 | Brode | 307/214 |
| 3,221,182 | 11/1965 | Anderson | 307/214 |
| 3,381,144 | 4/1968 | Thomas | 307/214 |
| 3,654,486 | 4/1972 | Cubert | 307/214 |
| 3,867,644 | 2/1975 | Cline | 307/213 |
| 3,916,218 | 10/1975 | Berger | 307/213 |
| 3,956,641 | 5/1976 | Berger et al. | 307/215 |

*Primary Examiner*—Harold A. Dixon
*Attorney, Agent, or Firm*—Thomas J. Kilgannon, Jr.

[57] ABSTRACT

An inverter is disclosed which includes a fast turn-on circuit and a turn-off circuit comprising a standby current source and a parallel circuit of a diode and capacitor connected to the input of a bipolar transistor. Standby current plus an input transient applied via the charged capacitor cause high speed turn-on of the bipolar device. The diode having a lower threshold than the bipolar base-emitter diode switches when a turn-off transient is applied to the bipolar device shunting standby current which held the bipolar in the conducting state to ground via the conducting diode.

25 Claims, 2 Drawing Figures

BIPOLAR INVERTER AND NAND LOGIC CIRCUIT WITH EXTREMELY LOW DC STANDBY POWER

DESCRIPTION

1. Technical Field

This invention relates to digital logic circuits and more particularly relates to inverter and NAND logic circuits with extremely low DC standby power. The circuits are also adapted to operate at extremely high speed. Because of the low power dissipation and high speed, the effective speed-power ratio is improved along with a power times delay factor which is improved by an order of magnitude relative to known circuits.

2. Background Art

Bipolar inverters and NAND circuits which utilize bipolar devices are already well known. An example of the latter is shown in U.S. Pat. No. 3,956,641 entitled "Complementary Transistor Circuit for Carrying Out Boolean Functions" in the names of Berger et al, filed Feb. 11, 1975 and assigned to International Business Machines Corporation. The circuit of FIG. 2C of the patent is identical with the circuit of the present application except that sources of standby current and the parallel arrangement of a diode and capacitor, in accordance with the teaching of the present application, are not connected to the bases of the transistors. To the extent that the circuit of the patent does not incorporate the diode-capacitor networks in the base circuits of their devices, relative to the circuit of the present application, the NAND circuit of the reference has slower switching speeds and higher power dissipation. In addition, the devices utilized in the circuit of the reference have very stringent device parameter requirements in that both the input signal levels and power supply voltages must be controlled very precisely. The circuit of the present application represents an improvement over circuits of the type shown in the reference providing both higher switching speed and lower power dissipation.

U.S. Pat. No. 3,816,758 entitled "Digital Logic Circuits" in the names of Berger et al, filed Mar. 15, 1973 shows NAND and NOR circuits which utilize bipolar transistor devices. This reference does not incorporate the standby current sources of the present application nor does this incorporate the diode-capacitor network in the base circuits of each of the bipolar transistors as does the circuit of the present application.

U.S. Pat. No. 3,867,644 entitled "High Speed Low Power Schottky Integrated Logic Gate Circuit with Current Boost" in the name of R. L. Cline, filed Jan. 7, 1974 shows a high speed, low power Schottky integrated logic circuit of a quadruple two-input NAND gate. The patent, in one embodiment, shows a Schottky diode interposed between an input terminal and the base of a Schottky transistor. The diode is appropriately arranged to provide a voltage drop in an opposite sense to the base-emitter voltage drops of a pair of cascaded Schottky transistors. The sum of the voltage drops provides an input threshold. In another embodiment, a diode is provided between the input terminal and a pair of associated input diodes and the base input of a Schottky transistor. The first mentioned diode is connected in an opposite sense so that its voltage drop cancels out the input diode drop. In this way the threshold voltage is determined solely by the base-emitter voltage drops of a pair of cascaded transistors. In yet another embodiment, to overcome the speed limitations of the previous embodiment, a diode connected transistor has its collector coupled to the base input of a Schottky transistor. The base-emitter voltage drop of this device is in a sense so that it adds to the base-emitter voltage drops of a pair of cascaded Schottky transistors. Thus, the diode drop of the diode connected input transistor is cancelled out and a higher threshold voltage is provided. To improve the speed of this circuit, a current boost transistor is provided which provides a low impedance, high current path for charging the associated parasitic capacitance associated with the base to emitter of the first of the pair of cascaded Schottky transistors. The charging transistor provides the necessary current boost for fast switching. To the extent that diodes appear in the input circuits of the reference, they are utilized to provide voltage drops which are in an opposite sense to the voltage drops of other transistors.

The diodes of the reference, therefore, operate in a voltage cancellation mode to control the input threshold without performing any function which relates to removing a standby current source from the base of an associated transistor. To the extent that the patent provides enhanced speed to its circuit by charging up the emitter-base interelectrode capacitance of one of its devices, the patent recognizes that stored charge appropriately released can improve switching speed. The patent, however, utilizes a charging transistor to connect the supply current of the circuit to the interelectrode capacitance of one of the Schottky transistors of the circuit. The present circuit utilizes an actual capacitor in the base circuit of each of the logic devices and a low standby current source to charge this capacitor when the shunting diode is conducting standby current away from the base of its associated transistor. Thus, the reference circuit utilizes diodes for an entirely different purpose and, to the extent the reference utilizes stored charge to improve the speed of its circuit, it does so in a manner completely different from that taught by the present application.

Accordingly, it is a principal object of the present invention to provide bipolar logic circuits of extremely low DC power dissipation and high speed.

It is another object of the present invention to provide bipolar logic circuits which have an extremely low power-delay product which represents an order of magnitude improvement over known circuits.

It is another object of the present invention to provide improved logic circuits which may be implemented using any standard bipolar process.

Still another object is to provide bipolar logic circuits which have signal and power supply requirements which are less stringent than known logic circuits of the same type.

BRIEF SUMMARY OF THE INVENTION

The basic circuit disclosed is an inverter circuit which incorporates at least a single bipolar switchable transistor. In one embodiment incorporating NPN transistors, the emitter thereof is connected to a potential level which may be ground while the collector is connected via a load device to a power supply potential which is, for example, positive. The load device may be a resistor or a complementary PNP transistor. When the latter is nonconducting, the NPN transistor is conducting and vice versa. The base of the NPN transistor is connected to a source of standby current and to a parallel combination of a capacitor and diode both of which are connected to an input terminal. When the NPN transistor is switched OFF by the application of a negatively going signal, standby current from the current source is switched to ground via the diode which has a lower switching point than the emitter-base diode of the NPN transistor. The capacitor in parallel with the diode, is charged during this period so that when a positive going transient is applied at the input, the diode is backward-biased and the transient is applied along with the standby current to the base of the NPN transistor; switching it to the conducting or ON state. The capacitor has a capacitance which is much larger than the input capacitance of the NPN device so that the total voltage signal applied to the serially disposed capacitors is almost entirely across the smaller capacitor. Once the switching point or threshold of the base-emitter diode of the NPN device is reached by the voltage level of the input transient, the capacitor dumps charge resulting from the input transient into the base of the transistor which, along with the standby current, causes the bipolar transistor to switch at extremely high speeds. As indicated, hereinabove, when the NPN transistor is switched ON, the PNP load transistor is switched OFF. Under such circumstances, an output node between the devices is held at ground potential and, the up-level at the input terminal is inverted to a down-level at the output terminal. The base of the load transistor is connected to a source of standby current which is of opposite polarity to that applied to the base of the NPN transistor. A similar parallel circuit consisting of a capacitor and diode is connected to the base of the load transistor. The diode is, however, of oppositely polarity to that of the diode in the base circuit of the NPN transistor. The parallel circuit of the load transistor is connected to the input. When the diode associated with the NPN transistor is conducting, the diode associated with the load transistor is nonconducting and when the capacitor associated with the NPN transistor is delivering current to its associated transistor, the capacitor associated with the load device is being charged. The above-described inverter circuit operates at extremely high speed and with extremely low power dissipation.

In addition to the basic logic circuit, a two-input NAND circuit which includes a pair of PNP bipolar transistors and a pair of NPN bipolar transistors is disclosed. Each base of each transistor is connected to a parallel circuit which includes a capacitor and an appropriately poled diode each of which operates in the same manner as described hereinabove in connection with the inverter circuit. In addition, each base of each of the bipolar transistors is fed by a source of stand-by current. This circuit also operates with extremely high speed and with very low power dissipation. These circuits are amenable to fabrication in the integrated circuit environment and any standard process known to those skilled in the semiconductor art may be utilized in the implementation of these circuits.

These and other objects, features and advantages will be more apparent from the following more particular description of the preferred embodiments.

DETAILED DESCRIPTION OF THE PREFERRED EMBODIMENTS

Figure 1:
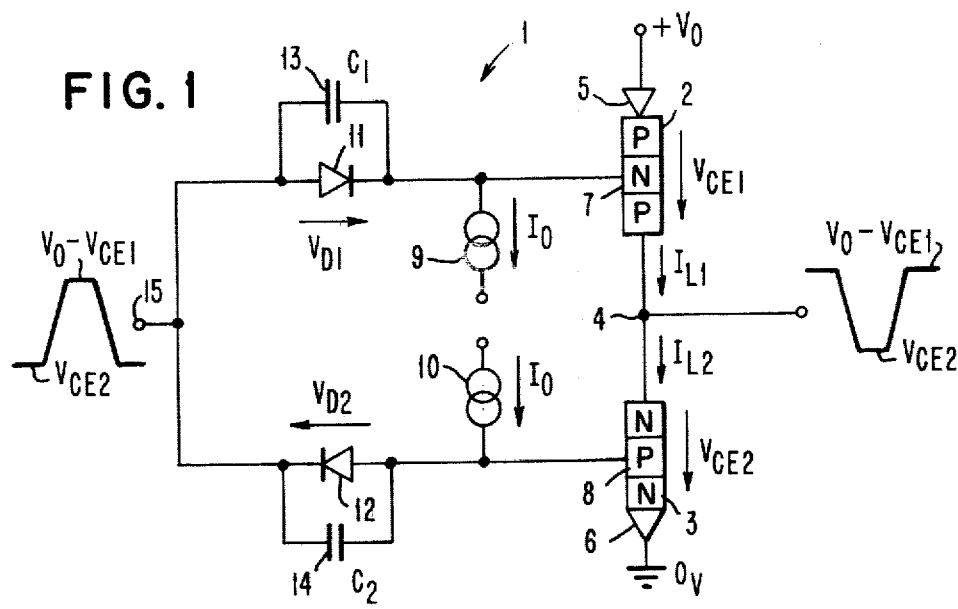
FIG. 1 is a schematic diagram of an inverter circuit.

Referring now to FIG. 1, there is shown therein a schematic diagram of an inverter circuit 1 which includes a PNP bipolar transistor device 2 and an NPN bipolar transistor device 3, the collectors of which are connected to a common output node 4. Emitter 5 of PNP device 2 is connected to a source of voltage $+V_O$ while emitter 6 of NPN device 3 is connected to ground potential. Bases 7, 8 of bipolar devices 2, 3, respectively, are connected to current sources 9,10, respectively. In FIG. 1, a pair of oppositely poled diodes 11, 12, are connected to the bases 7, 8, respectively, of devices 2, 3, respectively. Each of diodes 11, 12 is shunted by a capacitor 13, 14. Diodes 11, 12 are designed to have a lower switching point or threshold than the switching point or threshold of the base-emitter diodes of bipolar devices 2, 3. The reason for this will become apparent during the discussion of the operation of the circuit of FIG. 1 hereinbelow. Diode 11 is connected in circuit 1 such that a negative going transient backward-biases diode 11 rendering it nonconducting. Diode 12 experiencing the same negative going potential becomes forward-biased or conducting. Similarly, a positive going potential renders device 11 conducting while the same potential renders diode device 12 nonconducting. Finally, in FIG. 1, an input pulse is applied to input terminal 15 which is ultimately applied as a current to the bases of bipolar transistors 2, 3.

The circuit of FIG. 1 operates in the following way. Assuming that NPN bipolar transistor device 3 is in the ON condition after being switched ON by the application of a positive transient, device 3 is kept in that state by the application of a standby current to base 8 of device 3 from current source 10 which provides positive standby current $I_O$. At the same time device 3 is switched ON, bipolar transistor device 2 is switched to the OFF state. Output node 4 is, therefore, effectively at or near ground potential. Standby current $I_O$ is of sufficient value to keep device 3 in the ON state. When the input pulse applied to input terminal 15 goes to zero, base 8 of NPN device 3 experiences a negative transient, turning device 3 OFF. Because diode 12 has a current-voltage characteristic which permits it to switch at a lower potential than that at which the base-emitter diode of bipolar device 3 switches, diode 12 switches before the base-emitter diode of device 3 providing, via diode 12, a preferential path for standby current $I_O$ to ground. Output node 4 of inverter circuit 1 now rises to the voltage applied to the collector of device 2 minus any voltage drop in that device. Under the circumstances just described, device 2 has been rendered conducting as a result of the negative going transient applied to base 7 of device 2. Standby current of negative polarity from current source 9 applied to base 7 of device 2 then keeps device 2 in the conductive state. To turn device 3 ON again, a positive transient is applied to input terminal 15. At this point, diode 12 is backward-biased and becomes nonconducting. The positive transient is now passed by capacitor 14 and applied to base 8 of device 3. Device 3 switches upon reaching the switching point of the base-emitter diode of device 3 rendering device 3 conductive and dropping output node 4 to almost ground potential. When diode 12 is conducting, a voltage drop occurs across it and across capacitor 14 in parallel with diode 12. Under such circumstances, charge builds up on capacitor 14 which is a function of its capacitance and its voltage. When the positive transient is applied to input terminal 15, the voltage across capacitor 14 changes immediately. Then, when the threshold of the base-emitter diode of device 3 is exceeded, increased charge on capacitor 14 made available from source 10 is dumped as a current into base 8 of device 3 from whence it flows, via the base-emitter diode, to ground causing device 3 to switch at very high speed.

Capacitor 14 or $C_2$ is designed to have a capacitance which is much greater than the input capacitance of device 3. Capacitor $C_2$ and the input capacitance of device 3 are effectively in series before the positive transient is applied. When the input signal in the form of a positive transient is applied at input 15, almost the whole input signal of the series circuit appears initially across the input capacitance. When the emitter-base diode switch point of device 3 is exceeded, all the capacitive current of capacitor $C_2$ is shunted to ground via the emitter-base diode of device 3 and device 3 is forced to switch at extremely high speed. Output node 4 is now at approximately ground potential as a result of the conduction of device 3 and the nonconduction of device 2. At this point, it should be clear that when device 3 is conducting, device 2 is nonconducting and that diode 11 and capacitor 13 perform the same functions as do diode 12 and capacitor 14 except that the currents provided are of opposite polarity. Thus, when device 2 is ON, current $I_O$ flows from base 7, to source 9, and, when device 2 if OFF, current $I_O$ flows through diode 11 to source 9. In like manner, the charge provided by capacitor 13 is of proper polarity to augment the standby current from source 9. Devices 2, 3 may, of course, be interchanged without departing from the spirit of the present invention as long as current, signal and diode polarities are appropriate. It should also be clear that device 2 may be substituted for by a load resistor along with the elimination of elements 9, 11 and 13. In this way, the circuit of FIG. 1 would provide, at output node 4, the inverse of a signal applied at input terminal 15. Standby current $I_O$ from current source 10 would still be shunted to ground via diode 12 when forward biased and capacitor $C_2$ would still provide current to augment the standby current to cause the fast switching of device 3. Standby current, $I_O$, may be larger or smaller than a fixed value in a given circuit depending on the characteristics of the transistors.

In a practical circuit, bipolar transistor devices 2, 3 of inverter circuit 1 have high current gains $\beta_N$, $\beta_I$, respectively. Bipolar transistor devices 2, 3 are considered to be turned OFF, if their internal emitter currents, $I_E < I_O$ and turned ON if $I_E \geq m.I_O$ ($m \approx 10$). The load current at the collector terminal of device 3 is: $I_L < 2I_O$ when inverter 1 is loaded by a single inverter input.

The saturation voltage, $V_{CE2}$ of device 3 under such circumstances is:

$$V_{CE2} \approx 26 \text{ mV ln } (1+(2)/m) \ (m \approx 10)$$

$$V_{CE2} \approx 5 \text{ mV}$$

Thus, the down level signal at input terminal 15 is $\approx 5$ mV. In order to keep device 2 OFF, the following conditions apply:

$$V_{CE2} + V_{D2} \leq V_{BE2} \text{ or,}$$

$$V_{D2} \leq V_{BE2} - 5 \text{ mV, and, similarly}$$

$$D_{D1} \leq V_{BE1} - 5 \text{ mV}$$

The necessary voltage signal swing at input terminal 15 to turn NPN transistor device 3 ON is $$\Delta V_{BE} \leq 26 \text{ mV. ln } (1+m)$$

$\Delta V_{BE} \approx 62$ mV, if the internal emitter current is increased by a factor of $m = 10$.

(The voltage across diode 12 stays essentially the same since the base current of device 3 can be neglected for $\beta$ very much greater than 1). Thus, the supply voltage $V_O$ has to be $V_O \geq 72$ mV due to the relation $$V_O - V_{CE1} \geq V_{CE2} + \Delta V_{BE}$$

The voltage signals are slightly larger if a logic gate with a fan-in > 1 and a fan-out > 1 is considered.

By increasing the voltage swing, the switching current in output transistors 2, 3 can be greatly increased if diodes 11, 12 are shunted by relatively large capacitances $C_1$, $C_2$, respectively, compared to the effective input capacitance at the base terminals. Under such circumstances, the voltage swing at the input is transferred to the base input of device 3 or device 2 resulting in very fast switching despite a very low standby current, $I_O$.

Since in logic systems, the average utilization time of logic circuits is relatively low (<10%), the average power dissipation is significantly reduced compared to a static logic circuit of the same speed. The operating characteristics do not significantly change, if the current gains of transistors 2, 3 are low or if tolerances on device parameters have to be taken into account. In a preferred mode, the voltages of diodes 11, 12 should track with the voltages of the transistors. This can e.g. easily be achieved by utilizing the same structure with adjusted area ratios.

Standby current supplies 9, 10 can be implemented by a resistor or common base transistor load device fed by an auxiliary supply.

On a still more practical level, the following circuit parameters may be utilized in the fabrication of a circuit like that shown in FIG. 1.

| | |
|---|---|
| $+V_0 = 0.8V$ | $I_0 = 10 \mu a$ |
| Down level voltage = 0V | $B_N > 30$ |
| Up level voltage = 0.8V | $B_I > 15$ |
| Input Capacitance of Devices 2, 3 | $\leq 1$ picofarad |
| $C_1$, $C_2$ | $\leq 5$ picofarads |
| Base-emitter characteristics of Device 2, 3 | 720 mV at 10 $\mu a$ |
| Characteristic of Diodes 11, 12 | 660 mV at 10 $\mu a$ |

Figure 2:
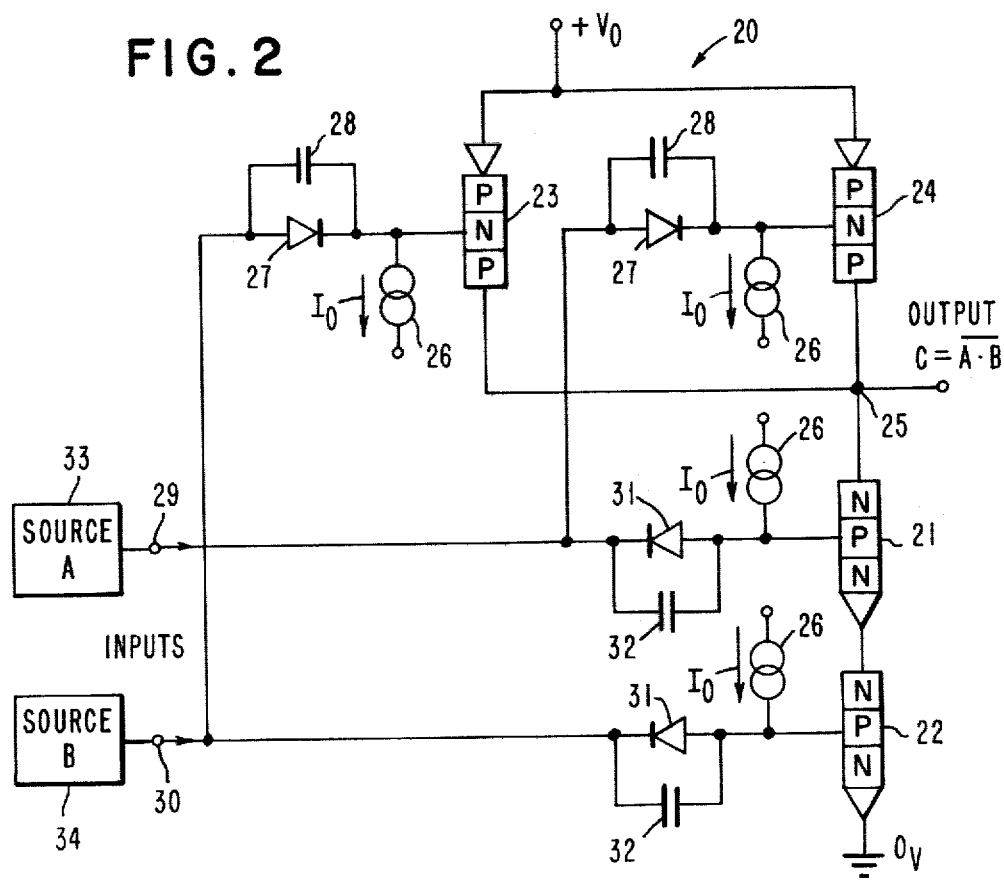
FIG. 2 is a schematic diagram of a NAND circuit.

Referring now to FIG. 2, there is shown schematic diagram of a NAND logic circuit similar to that shown in Fig. 1 of U.S. Pat. No. 3,956,641 referred to hereinabove in the discussion of the prior art. The present circuit differs from that shown in the referenced patent in that it features a diode/capacitor circuit at the input of each of the transistors shown and each base is fed from a source of standby current. The circuit delivers a NAND function at its output. The output is switched to about ground, if both input signals have high levels. If one of the input signals has a down level, the resulting output signal has an up level. The circuit of FIG. 2 represents a basic circuit for carrying out a NAND function (positive logic), or a NOR function (negative logic) where two input variables are applied to the circuit. It is a known fact that all complex logic functions may be realized by the combination of only such NAND or NOR functions.

Referring now in more detail to FIG. 2, NAND circuit 20 consists of two series connected NPN bipolar transistors 21, 22 which are similar to transistor device 3 of FIG. 1. Two PNP bipolar transistors 23, 24 are connected in parallel with their collectors connected to an output terminal 25. The latter is connected to the collector terminal of NPN bipolar transistor 21. The emitter of NPN bipolar transistor 22 is connected to ground potential while the emitters of bipolar transistors 23, 24 are connected to a source of power $+V_O$. Each of the bases of bipolar transistors 21–24 is connected to a current source of appropriate polarity to act as a source of standby current for maintaining a switched bipolar transistor in its ON condition. Thus, the current sources associated with the PNP devices 23, 24 are sources of negative polarity while current sources 26 associated with NPN bipolar transistors 21, 22 are sources of positive polarity. The bases of PNP transistors 23, 24 are connected to diodes 27 both of which are forward biased by a positive transient. Diodes 27 are shunted by capacitors 28 and the parallel combination of diode 27 and capacitor 28 connected to the base of bipolar transistor 24 is connected to an input terminal 29, while the parallel combination of diode 27 and capacitor 28 associated with bipolar transistor 23 is connected to an input terminal 30. Input terminals 29, 30 are connected to pulsed voltage sources 33, 34, respectively, otherwise identified in FIG. 2 as Source A, Source B, respectively. The bases of bipolar transistors 21, 22 are similarly connected to a diode-capacitor combination. Specifically, the bases of transistors 21, 22 are connected to diodes 31 each of which is shunted by a capacitor 32. Diodes 31 are forward biased by a negative going transient. The parallel combination of diode 31 and capacitor 32 connected to the base of bipolar transistor 21 is connected to input terminal 29 while the parallel combination of diode 31 and capacitor 32 connected to the base of bipolar transistor 22 is connected to input 30. As indicated hereinabove, if two up-level signals are applied to input terminals 29, 30, transistors 21, 22 are rendered conducting and the potential at output node 25 is shunted to approximately ground. An up-level and a down-level applied simultaneously to terminals 29, 30, respectively, renders device 22 nonconductive and output node 25 is held approximately at the potential $+V_O$ in spite of the fact that transistor device 24 is rendered nonconducting. Pulsed sources 33, 34 provide appropriate signals or transients at input terminals 29, 30. A rectangular pulse, for example, which rises from ground potential to a positive level of voltage provides a positively going transient, while the fall from the positive level of voltage back to ground potential provides a negative going transient. The various transistors, diodes and capacitors of the circuits described hereinabove respond to the transients while the sources of standby current either keep a transistor in the ON state or charge up the circuit capacitances.

The operation of each of the transistors 21–24 is exactly the same as described in connection with the operation of transistors 2, 3 of FIG. 1. Thus, when a transistor device is rendered conducting, it is held in that state by current $I_O$ until the device experiences a proper polarity transition to render it nonconductive. In all instances, when a transistor device is turned off, standby current $I_O$ is shunted to ground or $+V_O$, respectively, via an associated diode. When any of the transistors are again rendered conductive, each time they conduct, they are switched by the combination of current provided by the appropriately poled transient and the standby current $I_O$.

As with the circuit of FIG. 1, capacitors 28, 32 have much larger capacitances than the input capacitance of their associated bipolar transistors. Also, diodes 27, 31 switch at a lower switching point than the switching point of the bipolar base-emitter diode thereby removing the standby base current $I_O$ from each of the transistor devices.

The above-described circuits provide extremely low power-delay products representing an improvement by an order of magnitude over known advanced logic like Merged Transistor Logic (MTL). In addition, extremely high switching speed in the sub-nanosecond range is possible. Very small input voltage swings result in an optimized power-speed ratio. Also, the ratio of active to standby power is largely independent of the current gains of the transistors utilized.

Since the process for fabricating such circuits forms no part of the present invention, nothing has been said about it up to this point. However, it should be appreciated that the circuits of the present application can be implemented in any standard bipolar process well known to those skilled in the semiconductor processing art without any special considerations being involved. Also, the diode-capacitor networks utilized in the circuits of the present application may be implemented in many ways without departing from processes well known to those skilled in the semiconductor arts.

The same circuit parameters described in connection with FIG. 1 may be utilized for a practical NAND circuit such as shown in FIG. 2.

It should also be appreciated that the arrangement of FIG. 2 can be expected in a straightforward way to include gates having more than two inputs as described in U.S. Pat. No. 3,956,641. Also, instead of the parallel PNP and serial NPN configurations, the parallel arrangement can be NPN and the serial arrangement PNP.

Having thus described my invention, what I claim as new, and desire to secure by Letters Patent is:

1. An inverter circuit comprising:
   at least a single bipolar switchable transistor, a first region of which is connected to a given potential and a second region of which is connected to a potential different from said given potential,
   a load device interposed between said potential different from said given potential and said second region,
   an output terminal connected to said second region and said load device,
   an input terminal connected to a third region of said transistor,
   a source of standby current of one polarity connected to said third region of said transistor for maintaining said transistor in a conductive state when rendered conductive by a signal applied to said input terminal,
   diode means connected between said source of standby current and said input terminal for shunting said source to said given potential when said transistor is rendered nonconductive and said diode means is rendered conductive by another signal applied to said input and, means connected to said third region of said transistor and said input terminal for augmenting said standby current when said signal is applied to said input terminal.

2. An inverter circuit according to claim 1 wherein said first region is the emitter of said transistor said second region is the collector of said transistor and said third region is the base of said transistor.

3. An inverter circuit according to claim 2 wherein the diode formed by said base and said emitter of said transistor has a given switching point and said transistor has a given input capacitance.

4. An inverter circuit according to claim 3 wherein said diode has a switching point which is lower than said given switching point of said diode formed by said base and said emitter of said transistor.

5. An inverter circuit according to claim 3 wherein said means for augmenting said standby current of one polarity is a capacitor, the charge on which is changed when said transistor is rendered conductive.

6. An inverter circuit according to claim 5 wherein said capacitor has a capacitance greater than said given input capacitance.

7. An inverter circuit according to claim 1 wherein said load device is another bipolar switchable transistor.

8. An inverter circuit according to claim 7 wherein said another bipolar switchable transistor is the complement of said switchable transistor and wherein a first region of said another bipolar switchable transistor is connected to said potential different from said given potential, a second region of said another bipolar switchable device is connected to said output terminal and said third region of said another bipolar device is connected to said input terminal,
- a source of standby current of a second polarity connected to said third region of said another transistor for maintaining said another transistor in a conductive state when rendered conductive by said another signal applied to said input terminal,
- means connected between said source of standby current of a second polarity and said input terminal for shunting said source of standby current of a second polarity to the potential level of said signal when said another transistor is rendered nonconductive by said signal applied to said input, and,
- means connected to said third region of said another transistor and said input terminal for augmenting said standby current of second polarity when said another signal is applied to said input terminal.

9. An inverter circuit according to claim 8 wherein said first region is the emitter of said another transistor, said second region is the collector of said another transistor and said third region is the base of said another transistor.

10. An inverter circuit according to claim 9 wherein the diode formed by the base and emitter of said another transistor has a given switching point and said another transistor has a given input capacitance.

11. An inverter circuit according to claim 10 wherein said means for shunting said source of standby current of a second polarity to said potential level of said signal is a diode which is rendered conductive by the application of said signal applied to said input.

12. An inverter circuit according to claim 10 wherein said means for augmenting said standby current of second polarity is a capacitor, the charge on which is changed when said another transistor is rendered conductive.

13. An inverter circuit according to claim 11 wherein said diode has a switching point which is lower than said given switching of said diode formed by said base and said emitter of said another transistor.

14. An inverter circuit according to claim 12 wherein said capacitor has a capacitance greater than said given input capacitance of said another transistor.

15. An inverter circuit according to claim 1 wherein said means for augmenting said standby current of one polarity is a capacitor, the charge on which is changed when said transistor is rendered conductive.

16. An inverter circuit according to claim 1 further including means connected to said input terminal for applying said signal and said another signal to said inverter circuit.

17. A logic circuit comprising:
- a first pair of bipolar switchable transistors connected in series a first region of one of said first pair being connected to a given potential,
- a second pair of bipolar switchable transistors which are the complements of said first pair of transistors connected in parallel, first regions of which are connected to a potential different from said given potential and second regions of which are connected to a second given region of another of said first pair, a first region of said another of said first pair being connected to a second region of said one of said first pair, an output terminal connected to said second regions of said second pair of transistors and to said second region of said another of said first pair, a first input terminal connected to a third region of said one of said first pair of transistors and to a third region of one of said second pair input terminal connected to a third region of said another of said first pair of transistors and to a third region of another of said second pair of transistors,
- a source of standby current of a first polarity connected to each of said third regions of said first pair of transistors for maintaining said transistors in a conductive state when rendered conductive by a signal applied to said first and second inputs terminals,
- a source of standby current of a second polarity connected to each of said third regions of said second pair of transistors for maintaining said transistors in a conductive state when rendered conductive by another signal applied to said first and second input terminals,
- means connected between each of said sources of standby current and said input terminals for shunting said sources of standby current of said first and second polarity to said given potential and to the level of said signal, respectively, when said signal or said another signal applied to any of said transistors of said first and second pairs of transistors renders any of them nonconductive, and, means connected in parallel with each said means for shunting for augmenting said standby current of one polarity and said standby current of second polarity when the application of said signal or said another signal to said third regions of said first and second pairs of transistors renders any of said transistors conductive.

18. A logic circuit according to claim 17 wherein said first regions, said second regions and said third regions are emitters, collectors and bases, respectively, of said transistors.

19. A logic circuit according to claim 18 further including means connected to said input terminals for applying said signal and said another signal to said logic circuit.

20. A logic circuit according to claim 18 wherein said means for shunting said sources of standby current of said first and second polarity to said given potential and to said level of said signal, respectively, are first and second diodes which are rendered conductive by the application of said another signal and said signal, respectively, to said input.

21. A logic circuit according to claim 20 wherein the diodes formed by said bases and said emitters of said transistors have a given switching point.

22. A logic circuit according to claim 21 wherein said first and second diodes have a switching point which is lower than said given switching point of said diodes formed by said bases and said emitters of said transistors.

23. A logic circuit according to claim 18 wherein said means for augmenting said standby current of one polarity and said standby current of a second polarity is a capacitor, the charge on which is changed when said transistors are rendered conductive.

24. A logic circuit according to claim 23 wherein transistors have a given input capacitance.

25. A logic circuit according to claim 24 wherein said capacitor has a capacitance which is greater than said given input capacitance.

* * * * *